(12) United States Patent
Huang et al.

(10) Patent No.: US 7,002,245 B2
(45) Date of Patent: Feb. 21, 2006

(54) SEMICONDUCTOR PACKAGE HAVING CONDUCTIVE BUMPS ON CHIP AND METHOD FOR FABRICATING THE SAME

(75) Inventors: Chien-Ping Huang, Taichung Hsien (TW); Cheng-Hsu Hsiao, Taichung Hsien (TW)

(73) Assignee: Siliconware Precicion Industries Co., Ltd., (TW)

( * ) Notice: Subject to any disclaimer, the term of this patent is extended or adjusted under 35 U.S.C. 154(b) by 0 days.

(21) Appl. No.: 10/643,375

(22) Filed: Aug. 18, 2003

(65) Prior Publication Data
US 2004/0245608 A1    Dec. 9, 2004

(30) Foreign Application Priority Data
Jun. 9, 2003    (TW) ................ 92115508 A

(51) Int. Cl.
*H01L 23/053* (2006.01)

(52) U.S. Cl. ............. 257/701; 257/737; 257/678

(58) Field of Classification Search ......... 257/701, 257/737, 738, 678, 687
See application file for complete search history.

(56) References Cited

U.S. PATENT DOCUMENTS

| | | | |
|---|---|---|---|
| 5,892,179 A | 4/1999 | Rinne et al. | 174/261 |
| 6,103,552 A | 8/2000 | Lin | 438/113 |
| 6,271,469 B1 | 8/2001 | Ma et al. | 174/52.4 |
| 6,287,893 B1 | 9/2001 | Elenius et al. | 438/108 |
| 6,350,668 B1 | 2/2002 | Chakravorty | 438/612 |
| 6,433,427 B1 | 8/2002 | Wu et al. | 257/737 |
| 6,701,614 B1 * | 3/2004 | Ding et al. | 29/848 |
| 6,734,534 B1 * | 5/2004 | Vu et al. | 257/668 |
| 6,750,397 B1 * | 6/2004 | Ou et al. | 174/52.4 |

* cited by examiner

*Primary Examiner*—Douglas W Owens
(74) *Attorney, Agent, or Firm*—Peter F. Corless; Steven M. Jensen; Edwards Angell Palmer & Dodge LLP

(57) ABSTRACT

A semiconductor package having conductive bumps on a chip and a fabrication method thereof are provided. A plurality of the conductive bumps are deposited respectively on bond pads of the chip. An encapsulation body encapsulates the chip and conductive bumps while exposing ends of the conductive bumps. A plurality of conductive traces are formed on the encapsulation body and electrically connected to the exposed ends of the conductive bumps. A solder mask layer is applied over the conductive traces and formed with openings for exposing predetermined portions of the conductive traces. The exposed portions of the conductive traces are connected to a plurality of solder balls respectively.

8 Claims, 6 Drawing Sheets

SEMICONDUCTOR PACKAGE HAVING CONDUCTIVE BUMPS ON CHIP AND METHOD FOR FABRICATING THE SAME

FIELD OF THE INVENTION

The present invention relates to semiconductor packages and fabrication methods thereof, and more particularly, to a semiconductor package not having a chip carrier, and a method for fabricating the semiconductor package.

BACKGROUND OF THE INVENTION

A semiconductor package is used to accommodate at least one integrated circuit component such as semiconductor chip and preferably made compact in size. To achieve this goal, there is a type of small scale semiconductor package, named chip scale package (CSP), which has a size substantially equal or slightly larger than that of the chip incorporated therein.

U.S. Pat. Nos. 5,892,179, 6,103,552, 6,287,893, 6,350,668 and 6,433,427 disclose a CSP structure which directly fabricates build-up layers on a chip and utilizes a RDL (redistribution layer) technique to redistribute bond pads of the chip to predetermined positions, while not requiring a chip carrier such as substrate or lead frame. As shown in FIG. 5, such a CSP structure has a plurality of build-up layers formed on an active surface 100 of the chip 10, including: a dielectric layer 11 disposed over the active surface 100 of the chip 10 and formed with a plurality of vias 110 for exposing bond pads 101 of the chip 10; and a plurality of conductive traces 12 formed on the dielectric layer 11 and electrically connected to the exposed bond pads 101 of the chip 10. A solder mask layer 13 is applied over the conductive traces 12 and formed with a plurality of openings 130, allowing predetermined portions of the conductive traces 12 to be exposed via the openings 130 and bonded to solder balls 14 which serve as input/output (I/O) connections for electrically connecting the chip 10 to an external device such as printed circuit board (not shown). Therefore, the bond pads 101 of the chip 10 are redistributed via the conductive traces 12 to the positions bonded with the solder balls 14 and thus electrically connected to the solder balls 14. In other words, if bond pads formed on a chip are located at peripheral area or arranged by uneven pitches, they can be redistributed using the RDL technique by means of conductive traces to array-arranged positions predetermined for bonding solder balls, and thus a ball grid array or array-arranged solder balls can be subsequently disposed on the predetermined positions to be electrical connected to the bond pads via the conductive traces.

The above CSP structure, however, is defective in that the use of RDL technique or the arrangement of conductive traces is limited in accordance with the chip size or area of the active surface of the chip. Especially with increase in the chip integration and reduction of the chip size, the chip usually cannot provide sufficient surface area for accommodating relatively more solder balls desirably required for the external electrical connection. Accordingly, U.S. Pat. No. 6,271,469 discloses another package structure which forms build-up layers on a chip and provides additional or more surface area for carrying solder balls or I/O connections. As shown in FIG. 6, this package structure uses an encapsulation body 15 to encapsulate a non-active surface 102 and side surfaces 103 of the chip 10, with the active surface 100 of the chip 10 exposed outside and flush with a surface 150 of the encapsulation body 15. A first dielectric layer 16 is applied over the active surface 100 of the chip 10 and the surface 150 of the encapsulation body 15, the first dielectric layer 16 having a plurality of vias 160 formed by a laser drilling technique for exposing the bond pads 101 of the chip 10. A plurality of conductive traces 12 (hereinafter referred to as "first conductive traces") are formed on the first dielectric layer 16 and electrically connected to the exposed bond pads 101. Then, a second dielectric layer 17 is disposed over the first conductive traces 12 and formed with a plurality of vias 170 for exposing predetermined portions of the first conductive traces 12. A plurality of second conductive traces 18 are formed on the second dielectric layer 17 and electrically connected to the exposed portions of the first conductive traces 12. Finally, the solder mask layer 13 is applied over the second conductive traces 18, allowing predetermined portions of the second conductive traces 18 to be exposed via the openings 130 of the solder mask layer 13 and bonded to the solder balls 14. Therefore, the surface 150 of the encapsulation body 15 that encapsulates the chip 10 provides more surface area than the active surface 100 of the chip 10 and can be mounted with more solder balls 14 for external electrical connection.

However, a significant drawback incurred by the above package structure is that when the laser drilling technique is employed to form vias through the first dielectric layer for exposing the bond pads on the chip, the bond pads covered by the first dielectric layer cannot be easily and precisely recognized by laser in position, making the vias not able to accurately correspond to the positions of the bond pads. As a result, the bond pads on the chip fail to be completely exposed, and electrical connection between the conductive traces and the incompletely-exposed bond pads is degraded, thereby damaging yield and reliability of the fabricated packages. Moreover, the provision of first dielectric layer on the chip and encapsulation body and the use of laser drilling technique would undesirably increase fabrication costs and process complexity. Besides, since the first dielectric layer has a different coefficient of thermal expansion (CTE) from the chip and encapsulation body, under a high temperature environment or in a thermal cycle, delamination may easily occur at interface between the first dielectric layer and the chip or encapsulation body due to different thermal stresses produced therefrom, making the quality and reliability of the fabricated products degraded.

Therefore, the problem to be solved herein is to provide a semiconductor package which can assure electrical connection between conductive traces and bond pads formed on the chip and improve the production yield and reliability of the semiconductor package.

SUMMARY OF THE INVENTION

An objective of the present invention is to provide a semiconductor package having conductive bumps on a chip and a method for fabricating the semiconductor package, having a plurality of the conductive bumps respectively formed on bond pads of the chip so as to allow easy positional recognition of the bond pads and assure electrical connection between the bond pads and conductive traces, thereby improving production yield and reliability of the semiconductor package.

Another objective of the present invention is to provide a semiconductor package having conductive bumps on a chip and a method for fabricating the semiconductor package, not having to deposit a dielectric layer directly on the chip and use a laser drilling technique to form vias through the dielectric layer, thereby reducing fabrication costs and simplifying fabrication processes.

A further objective of the present invention is to provide a semiconductor package having conductive bumps on a chip and a method for fabricating the semiconductor package, not having to coat a dielectric layer directly on the chip and an encapsulation body encapsulating the chip, thereby preventing delamination at interface between the dielectric layer and the chip or encapsulation body due to CTE (coefficient of the thermal expansion) mismatch.

In accordance with the above and other objectives, the present invention proposes a semiconductor package having conductive bumps on a chip, comprising: at least one chip having an active surface and an opposite inactive surface, and having a plurality of bond pads formed on the active surface; a plurality of conductive bumps respectively formed on the bond pads of the chip; an encapsulation body for encapsulating the chip and the conductive bumps, wherein ends of the conductive bumps are exposed outside of the encapsulation body and flush with a surface of the encapsulation body; a plurality of conductive traces formed on the surface of the encapsulation body and electrically connected to the exposed ends of the conductive bumps; a solder mask layer applied over the conductive traces and having a plurality of openings for exposing predetermined portions of the conductive traces; and a plurality of solder balls respectively formed on the exposed portions of the conductive traces.

The above semiconductor package can be fabricated by the steps of: preparing a wafer comprising a plurality of chips, each chip having an active surface and an opposite inactive surface, and having a plurality of bond pads formed on the active surface; forming a plurality of conductive bumps respectively on the bond pads of each of the chips; singulating the wafer to form the plurality of individual chips, each chip having a plurality of the conductive bumps thereon; providing a carrier for accommodating the plurality of chips, and mounting the conductive bumps of each of the chips on a surface of the carrier; forming an encapsulation body on the surface of the carrier for encapsulating the chips and the conductive bumps; removing the carrier to allow ends of the conductive bumps to be exposed outside of the encapsulation body and flush with a surface of the encapsulation body; forming a plurality of conductive traces on the surface of the encapsulation body and electrically connecting the conductive traces to the exposed ends of the conductive bumps; applying a solder mask layer over the conductive traces and forming a plurality of openings through the solder mask layer for exposing predetermined portions of the conductive traces; depositing a plurality of solder balls respectively on the exposed portions of the conductive traces; and cutting the encapsulation body to form a plurality of individual semiconductor packages each having a singulated chip.

The above semiconductor package according to the invention first implants a plurality of conductive bumps on bond pads of the chip and then forms an encapsulation body which encapsulates the chip and conductive bumps whose ends are adapted to be exposed outside of the encapsulation body, so as to allow build-up layers to be subsequently formed on the exposed ends of the conductive bumps. This semiconductor package yields significant benefits. The exposed ends of the conductive bumps allow easy position recognition of the bond pads of the chip, such that conductive traces subsequently formed on the encapsulation body can be well electrically connected to the bond pads through the conductive bumps, thereby improving the production yield and reliability of the semiconductor package. Therefore, compared to the prior art coating a dielectric layer on a chip and an encapsulation body encapsulating the chip and using a laser drilling technique to form a plurality of vias through the dielectric layer for exposing bond pads of the chip, the semiconductor package according to the invention does not require the dielectric layer and laser drilling technique, thereby reducing fabrication costs and simplifying fabrication processes. In the invention, the bond pads of the chip are not covered by the dielectric layer, which eliminates the problems that the bond pads, as being hard to accurately recognized in position by laser, cannot be precisely or completely exposed by the vias through the dielectric layer, and thus electrical connection between the bond pads and conductive traces are degraded. Further, there is no dielectric layer applied over the chip and encapsulation body, which eliminates the problem of delamination between the dielectric layer and the chip or encapsulation body due to CTE mismatch.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package having conductive bumps on a chip and a method for fabricating the semiconductor package proposed by the present invention are described in detail with reference to FIGS. 1, 2A–2H, 3 and 4 as follows.

First Preferred Embodiment

Figure 1:
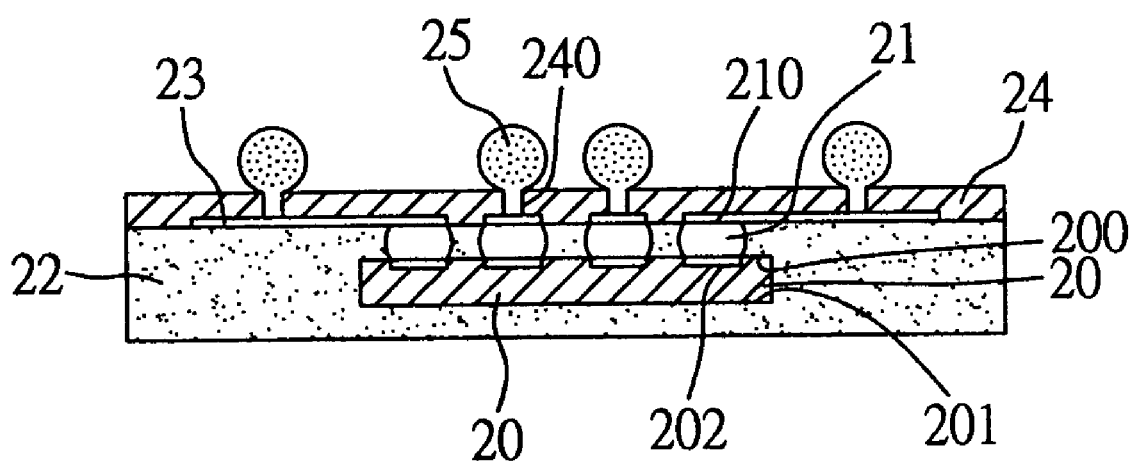
FIG. 1 is a schematic diagram showing a cross-sectional view of a semiconductor package according to a first preferred embodiment of the invention.

As shown in FIG. 1, the semiconductor package according to the invention comprises: at least one chip 20 having an active surface 200 and an opposite inactive surface 201, and having a plurality of bond pads 202 formed on the active surface 200; a plurality of conductive bumps 21 respectively formed on the bond pads 202 of the chip 20; an encapsulation body 22 for encapsulating the chip 20 and the conductive bumps 21, wherein ends 210 of the conductive bumps 21 are exposed outside of the encapsulation body 22; a plurality of conductive traces 23 formed on the encapsulation body 22 and electrically connected to the exposed ends 210 of the conductive bumps 21; a solder mask layer 24 applied over the conductive traces 23 and having a plurality of openings 240 for exposing predetermined portions of the conductive traces 23; and a plurality of solder balls 25 respectively formed on the exposed portions of the conductive traces 23.

The above semiconductor package can be fabricated by procedural steps shown in FIGS. 2A–2H.

Figure 2A:
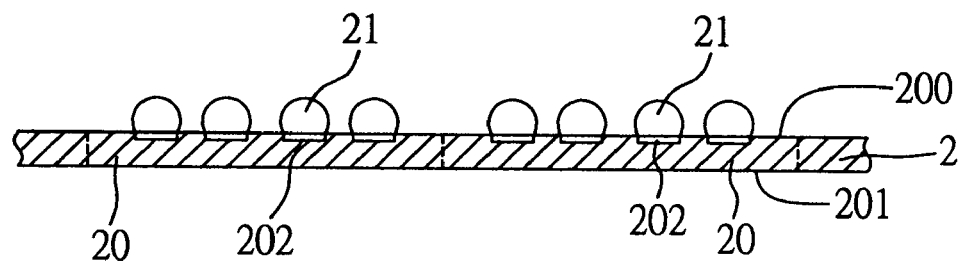
FIGS. 2A to 2H are schematic diagrams showing procedural steps of a method for fabricating the semiconductor package shown in FIG. 1.

Referring to FIG. 2A, the first step is to prepare a wafer 2 comprising a plurality of chips 20, each chip 20 having an active surface 200 and an opposite inactive surface 201, and having a plurality of bond pads 202 formed on the active surface 200. Then, a bumping or stud bumping process is carried out to form a conductive bump 21 on each of the bond pads 202 of the chips 20. The conductive bump 21 can be a solder bump, high lead solder bump, gold bump, or gold stud bump.

Figure 2B:
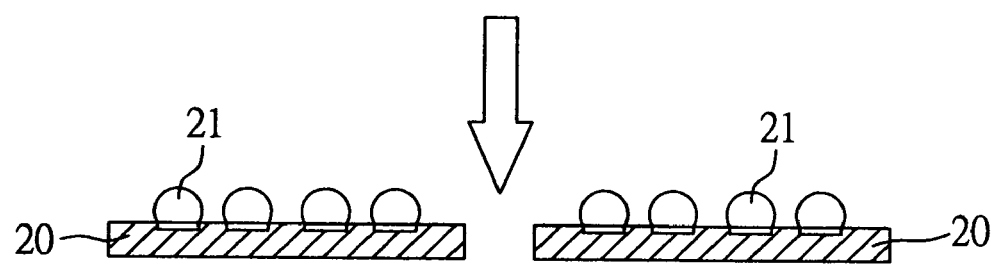

Referring to FIG. 2B, the next step is to perform a singulation process to cut the wafer 2 to form a plurality of individual chips 20, each chip 20 having a plurality of the conductive bumps 21 thereon.

Figure 2C:
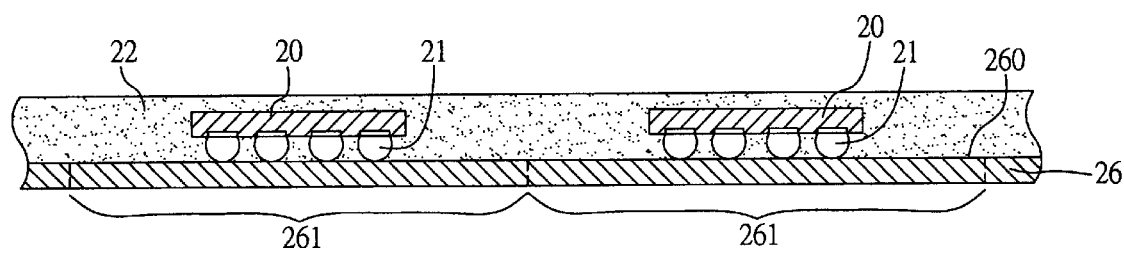

Referring to FIG. 2C, a carrier 26 such as tape is provided to accommodate the plurality of chips 20 whose conductive bumps 21 are mounted on a surface 260 of the carrier 26. The surface 260 of the carrier 26 is defined to form a plurality of package units 261 each for carrying at least one of the chips 20 thereon.

Then, a molding process is performed, using a conventional resin material such as epoxy resin to form an encapsulation body 22 on the surface 260 of the carrier 26 for encapsulating all the chips 20 and conductive bumps 21 mounted on the carrier 26.

Figure 2D:
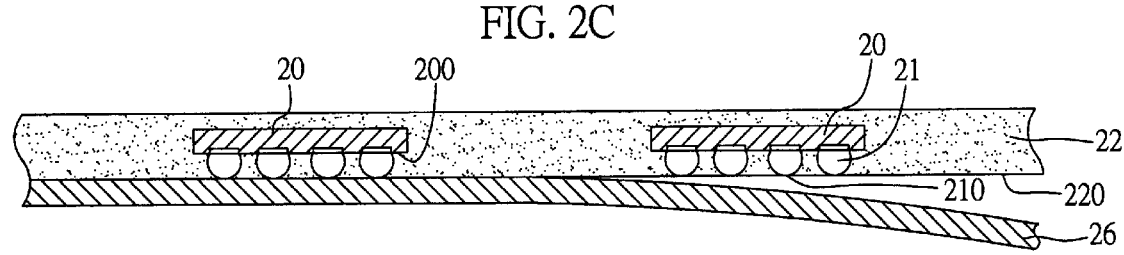

Referring to FIG. 2D, the carrier 26 is removed or peeled from the encapsulation body 22, such that ends 210 of the conductive bumps 21 in contact with the carrier 26 are exposed outside of the encapsulation body 22 and substantially flush with a surface 220 of the encapsulation body 22.

Figure 2E:
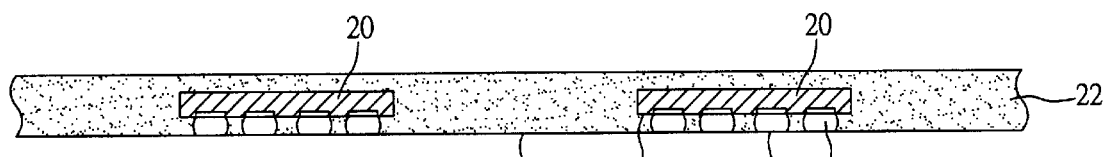

It is an option as shown in FIG. 2E to perform a grinding process such as mechanical grinding to grind the surface 220 of the encapsulation body 22 flush with the ends 210 of the conductive bumps 21. This is to assure the exposure of the ends 210 of the conductive bumps 21 and planarity of the surface 220 of the encapsulation body 22. It allows subsequent build-up layers to be formed on the exposed ends 210 of the conductive bumps 21, and the surface 220 of the encapsulation body 22 provides more surface area, as compared to the active surfaces 200 of the chips 20, for accommodating the subsequent build-up layers and more input/output (I/O) connections (not shown).

Figure 2F:
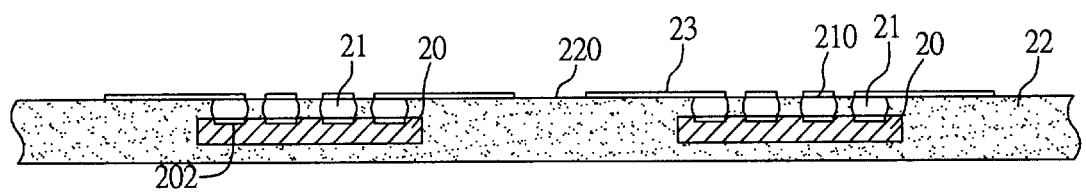

Thereafter, referring to FIG. 2F, a conventional photolithography technique is employed to form a plurality of conductive traces 23 on the surface 220 of the encapsulation body 22 and electrically connect each of the conductive traces 23 to at least one of the exposed ends 210 of the conductive bumps 21. As a result, the bond pads 202 of the chips 20 can be redistributed to predetermined positions, for example those in electrical connection with subsequent I/O connections (not shown), by means of the conductive bumps 21 and conductive traces 23. The conductive traces 23 are made of a conductive material such as copper, aluminum, or alloy thereof.

Figure 2G:
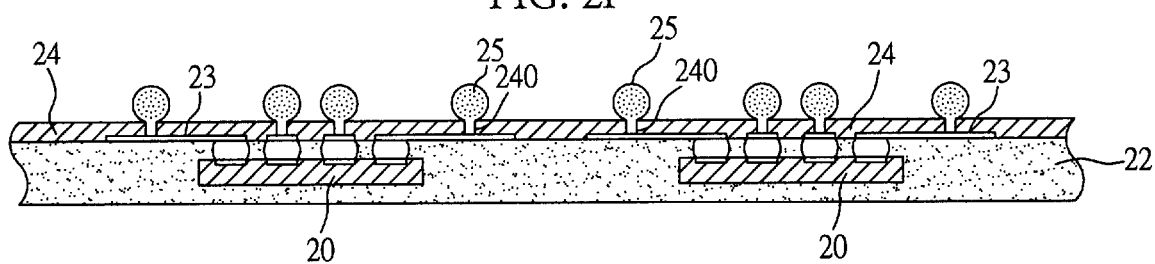

Referring to FIG. 2G, after forming the conductive traces 23 on the encapsulation body 22, a solder mask layer 24 is applied over the conductive traces 23 and formed with a plurality of openings 240 for exposing predetermined portions of the conductive traces 23. The exposed portions of the conductive traces 23 can be terminals.

Then, a screen printing process is implemented to deposit a solder ball 25 on each of the exposed portions or terminals of the conductive traces 23. The solder balls 25 serve as I/O connections to establish electrical connection between the chips 20 and an external device such as printed circuit board (not shown).

Figure 2H:
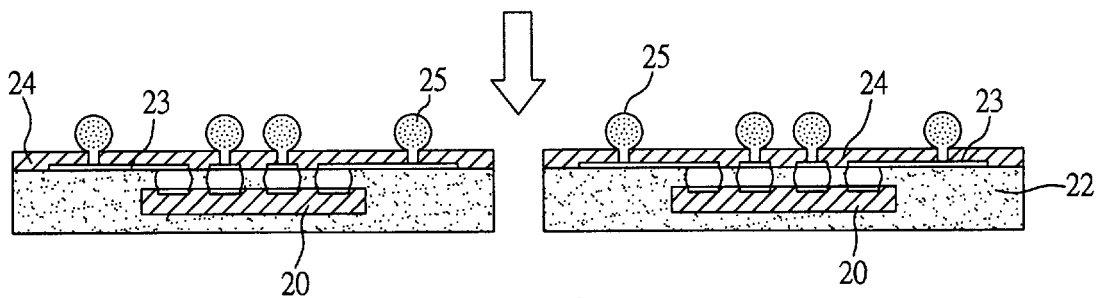

Finally, referring to FIG. 2H, a singulation process is carried out to cut the encapsulation body 22 to form a plurality of individual semiconductor packages each having a singulated chip 20.

The above semiconductor package according to the invention first implants a plurality of conductive bumps on bond pads of the chip and then forms an encapsulation body which encapsulates the chip and conductive bumps whose ends are adapted to be exposed outside of the encapsulation body, so as to allow build-up layers to be subsequently formed on the exposed ends of the conductive bumps. This semiconductor package yields significant benefits. The exposed ends of the conductive bumps allow easy position recognition of the bond pads of the chip, such that conductive traces subsequently formed on the encapsulation body can be well electrically connected to the bond pads through the conductive bumps, thereby improving the production yield and reliability of the semiconductor package. Therefore, compared to the prior art coating a dielectric layer on a chip and an encapsulation body encapsulating the chip and using a laser drilling technique to form a plurality of vias through the dielectric layer for exposing bond pads of the chip, the semiconductor package according to the invention does not require the dielectric layer and laser drilling technique, thereby reducing fabrication costs and simplifying fabrication processes. In the invention, the bond pads of the chip are not covered by the dielectric layer, which eliminates the problems that the bond pads, as being hard to accurately recognized in position by laser, cannot be precisely or completely exposed by the vias through the dielectric layer, and thus electrical connection between the bond pads and conductive traces are degraded. Further, there is no dielectric layer applied over the chip and encapsulation body, which eliminates the problem of delamination between the dielectric layer and the chip or encapsulation body due to CTE (coefficient of thermal expansion) mismatch.

Second Preferred Embodiment

Figure 3:
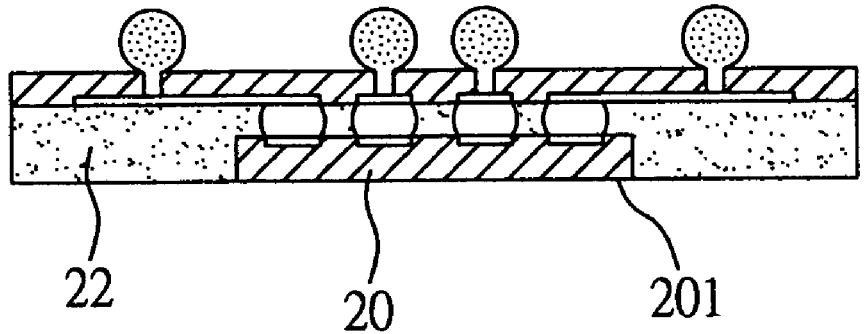
FIG. 3 is a schematic diagram showing a cross-sectional view of the semiconductor package according to a second preferred embodiment of the invention.

FIG. 3 shows a semiconductor package according to a second preferred embodiment of the invention. As shown, this semiconductor package is structurally similar to that of the first embodiment, with the difference in that during the grinding process of FIG. 2E, besides grinding the surface 220 of the encapsulation body 22 that is flush with the ends 210 of the conductive bumps 21, a portion of the encapsulation body 22 covering the inactive surface 201 of the chip 20 is ground off to allow the inactive surface 201 to be exposed.

In addition to the improvements achieved by the semiconductor package according to the above first embodiment, the exposed inactive surface 201 of the chip 20 help dissipate heat produced from the chip 20 to an external environment or the atmosphere, thereby enhancing heat dissipating efficiency of the semiconductor package according to this embodiment.

Third Preferred Embodiment

Figure 4:
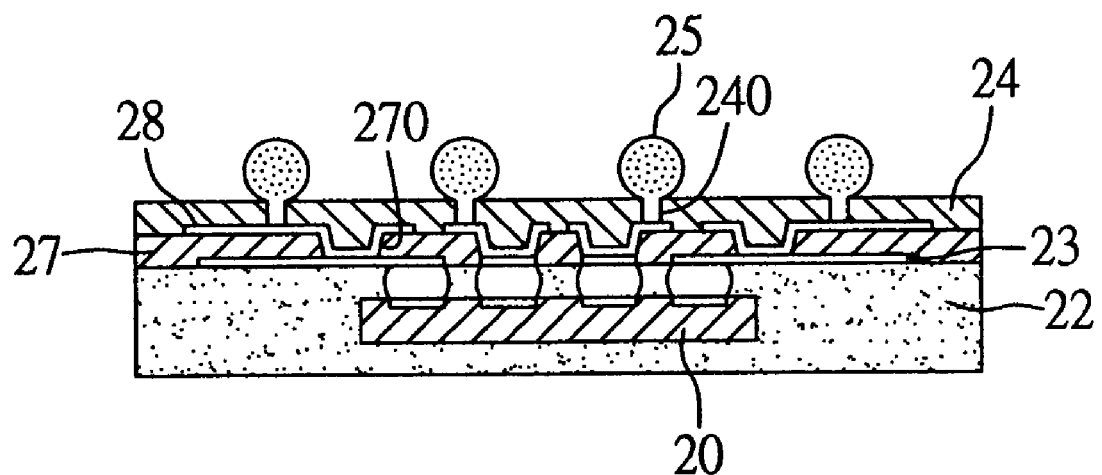
FIG. 4 is a schematic diagram showing a cross-sectional view of the semiconductor package according to a third preferred embodiment of the invention.
Figure 5:
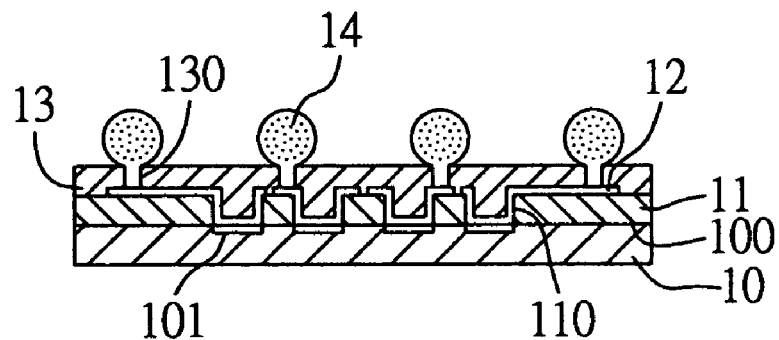
FIG. 5 (PRIOR ART) is a schematic diagram showing a cross-sectional view of a conventional semiconductor package.
Figure 6:
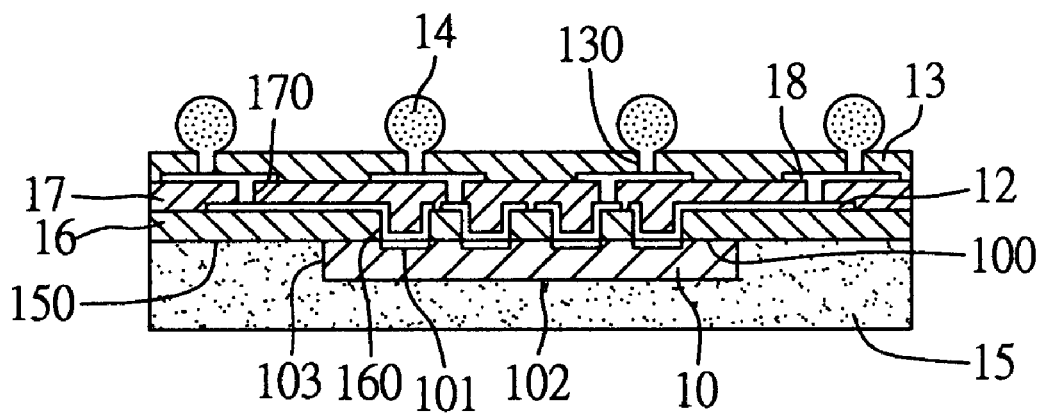
FIG. 6 (PRIOR ART) is a schematic diagram showing a cross-sectional view of another conventional semiconductor package.

FIG. 4 shows a semiconductor package according to a third preferred embodiment of the invention. As shown, this semiconductor package is structurally similar to that of the first embodiment, with the difference in that after forming the conductive traces 23 (hereinafter referred to as "first conductive traces") on the encapsulation body 22, at least one dielectric layer 27 is applied over the first conductive traces 23 and formed with a plurality of vias 270 penetrating through the dielectric layer 27, to allow predetermined portions of the first conductive traces 23 to be exposed by the vias 270. Then, a plurality of second conductive traces 28 are formed on the dielectric layer 27, and each of the second conductive traces 28 is adapted to be electrically connected to at least one of the exposed portions of the first conductive traces 23.

Afterwards, a solder mask layer 24 is applied over the second conductive traces 28 and formed with a plurality of openings 240 for exposing predetermined portions of the second conductive traces 28; the exposed portions of the second conductive traces 28 can be terminals. Subsequently, a conventional screen printing process is carried out to deposit a solder ball 25 on each of the exposed portions or terminals of the second conductive traces 28. The solder balls 25 serve as I/O connections of the semiconductor package to be electrically connected to an external device (not shown).

Besides the improvements achieved by the semiconductor package according to the above first embodiment, the dielectric layer 27 and second conductive traces 28 increases the number of build-up layers formed on the chip 20, thereby improving trace routability in the semiconductor package and electrical connection between the chip 20 and external device via the solder balls 25.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package having conductive bumps on a chip, comprising:
    at least one chip having an active surface and an opposite inactive surface, and having a plurality of bond pads formed on the active surface;
    a plurality of conductive bumps respectively formed on the bond pads of the chip;
    a single encapsulation body for completely encapsulating the chip and the conductive bumps, wherein ends of the conductive bumps are exposed outside of the encapsulation body and flush with a surface of the encapsulation body;
    a plurality of first conductive traces formed at the surface of the encapsulation body exposing the conductive bumps and electrically connected to the exposed ends of the conductive bumps;
    a solder mask layer applied over the first conductive traces and having a plurality of openings for exposing predetermined portions of the fist conductive traces; and
    a plurality of solder balls respectively formed on the exposed portions of the first conductive traces.

2. The semiconductor package of claim 1, further comprising: at least one dielectric layer and a plurality of second conductive traces formed on the dielectric layer, the dielectric layer and the second conductive traces interposed between the first conductive traces and the solder mask layer, wherein the dielectric layer is located on the first conductive truces and has a plurality of vias by which the predetermined portions of the first conductive traces are exposed and electrically connected to the second conductive traces, and the solder mask layer is located on the second conductive traces whose predetermined portions are exposed via the openings of the solder mask layer and respectively connected to the plurality of solder balls.

3. The semiconductor package of claim 1, wherein the inactive surface of the chip is exposed outside of the encapsulation body.

4. The semiconductor package of claim 2, wherein the inactive surface of the chip is exposed outside of the encapsulation body.

5. The semiconductor package of claim 1, wherein the conductive bump is selected from the group consisting of solder bump, high lead solder bump, gold bump, and gold stud bump.

6. The semiconductor package of claim 2 wherein the conductive bump is selected from the group consisting of solder bump, high lead solder bump, gold bump, and gold stud bump.

7. The semiconductor package of claim 1, wherein the exposed portions of the first conductive traces are terminals.

8. The semiconductor package of claim 2, wherein the exposed portions of the second conductive traces are terminals.

* * * * *